(12) United States Patent
Ku et al.

(10) Patent No.: US 8,220,630 B1
(45) Date of Patent: Jul. 17, 2012

(54) EUV POD WITH FASTENING STRUCTURE

(75) Inventors: Chen-Wei Ku, New Taipei (TW);
Pao-Yi Lu, New Taipei (TW);
Chin-Ming Lin, New Taipei (TW);
Jain-Ping Sheng, New Taipei (TW)

(73) Assignee: Gudeng Precision Industrial Co, Ltd, New Taipei ( * ) Notice: Subject to any disclaimer, the term of this patent is extended or adjusted under 35 U.S.C. 154(b) by 0 days.

(21) Appl. No.: 13/094,911

(22) Filed: Apr. 27, 2011

(30) Foreign Application Priority Data

Jan. 11, 2011 (TW) .................................. 100101022

(51) Int. Cl.
*B65D 85/48* (2006.01)
(52) U.S. Cl. ........................................ 206/454; 206/710
(58) Field of Classification Search .................. 206/454, 206/710, 711, 832; 220/23.87, 23.89; 355/30, 355/72, 75
See application file for complete search history.

(56) References Cited

U.S. PATENT DOCUMENTS

| | | | |
|---|---|---|---|
| 6,197,454 B1 | 3/2001 | Yan | |
| 6,216,873 B1* | 4/2001 | Fosnight et al. | 206/710 |
| 6,280,886 B1 | 8/2001 | Yan | |
| 6,646,720 B2 | 11/2003 | Ramamoorthy et al. | |
| 6,732,877 B2* | 5/2004 | Wu et al. | 206/710 |
| 6,906,783 B2 | 6/2005 | del Puerto et al. | |
| 7,159,719 B2 | 1/2007 | Golda | |
| 7,209,220 B2 | 4/2007 | Puerto et al. | |
| 7,304,720 B2 | 12/2007 | del Puerto et al. | |
| 7,400,383 B2* | 7/2008 | Halbmaier et al. | 355/72 |
| 7,469,788 B2* | 12/2008 | Chiu et al. | 206/710 |
| 7,477,358 B2 | 1/2009 | Phillips et al. | |
| 7,528,936 B2 | 5/2009 | Gregerson et al. | |
| 7,607,543 B2* | 10/2009 | Gregerson et al. | 206/710 |
| 7,804,583 B2 | 9/2010 | Phillips et al. | |
| 2004/0005209 A1* | 1/2004 | Su et al. | 206/710 |
| 2007/0206173 A1* | 9/2007 | Suzuki et al. | 355/75 |
| 2007/0258061 A1 | 11/2007 | Puerto et al. | |
| 2009/0301917 A1* | 12/2009 | Kolbow et al. | 206/454 |

* cited by examiner

*Primary Examiner* — Luan K Bui
(74) *Attorney, Agent, or Firm* — Ming Chow; Sinorica, LLC

(57) ABSTRACT

An EUV pod with fastening structure comprises an outer pod and an inner pod, wherein the upper cover of the inner pod is disposed with a plurality of retainers, and a plurality of supporters disposed on the outer pod of the EUV pod are used to press the plurality of retainers for the plurality of retainers to fasten and stabilize the reticle in the inner pod and thus ensure safety and stability of the reticle in the pod; by utilizing such design, risks of collisions of reticle in the pod due to vacillation of EUV pod during transportation can be reduced, and cost incurred by cracks and damages of reticles can also be greatly decreased.

18 Claims, 5 Drawing Sheets

EUV POD WITH FASTENING STRUCTURE

CROSS-REFERENCES TO RELATED APPLICATIONS

This application claims priority to Taiwan Patent Application No. 100101022, filed Jan. 11, 2011, the contents of which are hereby incorporated by reference in their entirety.

BACKGROUND OF THE INVENTION

1. Field of the Invention

The present invention is related to a reticle pod, and more particularly, to an EUV pod with fastening structure.

2. Description of the Prior Art

In the rapidly developing modern semiconductor technology, optical lithography tool plays an important role. The pattern definition relies fully on optical lithography technology. In the application of optical lithography tool related to semiconductors, pre-designed circuit paths are fabricated as light-transparent reticle in specific form. Basing on the principle of exposure, after light from the light source passes through the reticle and is projected on a silicon wafer, specific circuit pattern can be exposed on the silicon wafer. However, since any kind of dust (such as particles, powders, and organic matters) that adhere to the reticle can result in quality degradation of projected pattern, the reticle used to produce pattern on silicon wafers is required to be kept absolutely clean. Therefore, a cleanroom environment is usually provided in ordinary wafer fabrication processes to prevent from contamination caused by particles in the air.

In recent years, in order to further scale down the chip feature sizes, EUV (extreme ultraviolet light) at a wavelength of 157 nm is applied in lithography tool for the pattern on reticle to be imaged with higher resolution when being projected on the surface of a silicon wafer. However, when EUV is applied, the requirements for cleanliness of reticle pod are also, relatively speaking, higher. Particles smaller than 30 μm are previously acceptable, but as far as reticle pods for use with EUV lithography techniques are concerned, only particles with sizes between 30 and 50 nm are acceptable.

As a result, anti-contamination reticle pods are used in modern semiconductor process to store and carry reticles and to maintain the cleanliness of reticles; on the other hand, anti-contamination storage containers for semiconductor components are also used for storing and carrying semiconductor components and also for maintaining the cleanliness of semiconductor components. Reticle pods are used in the semiconductor process for storing reticles and for facilitating the carrying and transporting of reticles between platforms in order to isolate reticles from the air and thus prevent haze from forming on the surface of reticles due to contamination of reticles caused by particles and chemical gas. Thus, in advanced semiconductor plants, the cleanliness of reticle pods or storage devices for semiconductor components is usually required to comply with the SMIF (Standard Mechanical Interface) standard, in other words, to be maintained at Class 1 or below.

In order to reduce contamination generated during the process of storing, manufacturing, and transporting, a technology that uses a double-layer container for isolating the reticle has been proposed in the prior art, wherein an inner container is used for carrying the reticle and an outer container is used for fastening the inner container therein. As shown in FIG. 8, the lower cover c and the upper cover d of an inner container cover the reticle e and fasten the reticle e within the inner container, and then the lower cover a and the upper cover b of an outer container cover the inner container and fasten the inner container within the outer container. In the double-layer pod structure, supporters disposed in an outer container are usually used for fastening the inner container. However, in such double-layer pod structure, the user is unable to determine whether the inner container is stably snap-fastened by the supporters of the outer container and is unable to make sure the positioning status of the reticle in the inner container either. In consideration of the aforementioned, the present invention provides a reticle pod in which supporters of the outer container are used to press retainers of the inner container and thus indirectly fasten the reticle inside for ensuring safety and stability of the reticle in the reticle pod.

SUMMARY OF THE INVENTION

In order to solve the above-mentioned problem, one primary object of the present invention is to provide a reticle pod, in which supporters disposed on the outer container are used to press retainers of the inner container for indirectly fastening reticle inside the pod and thus ensuring the safety and stability of the reticle inside.

Another primary object of the present invention is to provide a reticle pod, in which supporters disposed on the outer container are used to press retainers of the inner container for preventing the inner container from shifting and further ensuring the safety of the reticle inside the inner container.

According to the objectives above, the present invention provides a reticle pod, in which a reticle is fastened in an inner container and the inner container is placed in an outer container; the outer container comprises: a lower cover of outer container having a first inner surface on which a plurality of first supporters are formed, and an upper cover of outer container having a second inner surface on which a plurality of second supporters are formed, a first accommodation space being formed by the first inner surface and the second inner surface for accommodating the inner container when the lower cover and the upper cover of the outer container are joined together; the inner container comprises: a lower cover of inner container placed in the first accommodation space and in contact with the plurality of first supporters, the lower cover of inner container having a first inner surface of inner container, and an upper cover of inner container placed in the first accommodation space, the upper cover of inner container having a second inner surface of inner container and an outer surface of upper cover of inner container on the opposite side of the second inner surface of inner container, a second accommodation space being formed by the first inner surface of inner container and the second inner surface of inner container for accommodating the reticle when the lower cover of the inner container and the upper cover of the inner container are joined together; wherein, the characteristic of the upper cover of inner container is in that: a plurality of through holes are formed between the second inner surface and the outer surface of the upper cover of inner container, and an O-shaped recess is formed around each of the through holes to surround each of the through holes, a spring element being formed in each of the O-shaped recesses; a plurality of retainers are disposed in each of the through holes and their positions correspond to each of the second supporters of the upper cover of outer container, each retainer being formed by a supporting convex pillar and an corresponding O-shaped protruding portion disposed in O-shaped recess, the length of supporting convex pillar being larger than the length of O-shaped protruding portion and the supporting convex pillar and the O-shaped protruding portion are an integrated structure, wherein each O-shaped protruding portion is in an O-shaped recess and in contact with a spring element.

By utilizing the design provided by the present invention, the reticle can be stably fastened in the inner container of the reticle pod and the inner container can also be fastened. The effect of fastening both the reticle and the inner container is thus achieved. Therefore, not only the risks of collisions of reticle in the pod due to vacillation of reticle pod during transportation can be reduced, but the cost incurred by cracks and damages of reticles can also be greatly decreased.

Still another primary object of the present invention is to provide a reticle pod, in which the window disposed on the inner container of the reticle pod is used for monitoring the condition of the interior of the inner container.

Therefore, according to the object above, the present invention provides a reticle pod, in which a reticle is fastened in an inner container and the inner container is placed in an outer container; the outer container comprises: a lower cover of outer container having a first inner surface on which a plurality of first supporters are formed, and an upper cover of outer container having a second inner surface on which a plurality of second supporters are formed, a first accommodation space being formed by the first inner surface and the second inner surface for accommodating the inner container when the lower cover and the upper cover of the outer container are joined together; the inner container comprises: a lower cover of inner container placed in the first accommodation space and in contact with the plurality of first supporters, the lower cover of inner container having a first inner surface of inner container, and an upper cover of inner container placed in the first accommodation space, the upper cover of inner container having a second inner surface of inner container and an outer surface of upper cover of inner container on the opposite side of the second inner surface of inner container, a second accommodation space being formed by the first inner surface of inner container and the second inner surface of inner container for accommodating the reticle when the lower cover of the inner container and the upper cover of the inner container are joined together; wherein, the lower cover of inner container is further disposed with a plurality of windows, each of the windows comprising: a transparent substrate, which is disposed on the window via the first inner surface of inner container, and a third retainer, which is a frame-shaped member with its size fitting the window and is disposed on the window and the transparent substrate via the first inner surface of inner container for fastening the transparent substrate.

By using the design provided by the present invention, when the inner container storing a reticle is introduced into the manufacturing process, the reticle inside can be monitored through the window from the platform for ensuring that the reticle inside is correctly positioned and thus preventing cracks of reticles from occurring during the process of transferring.

DESCRIPTION OF THE PREFERRED EMBODIMENTS

As the present invention discloses a reticle pod, and more particularly, a reticle pod with fastening/retaining structure; the inner container, outer container, and the filtering material employed in the embodiments of reticle pod of the present invention are achieved by using current technologies and the description of which is thus omitted. Moreover, the drawings referred to in the following description are not made according to the actual scale and only function as illustrations demonstrating characteristics of the present inventions.

Figure 1:
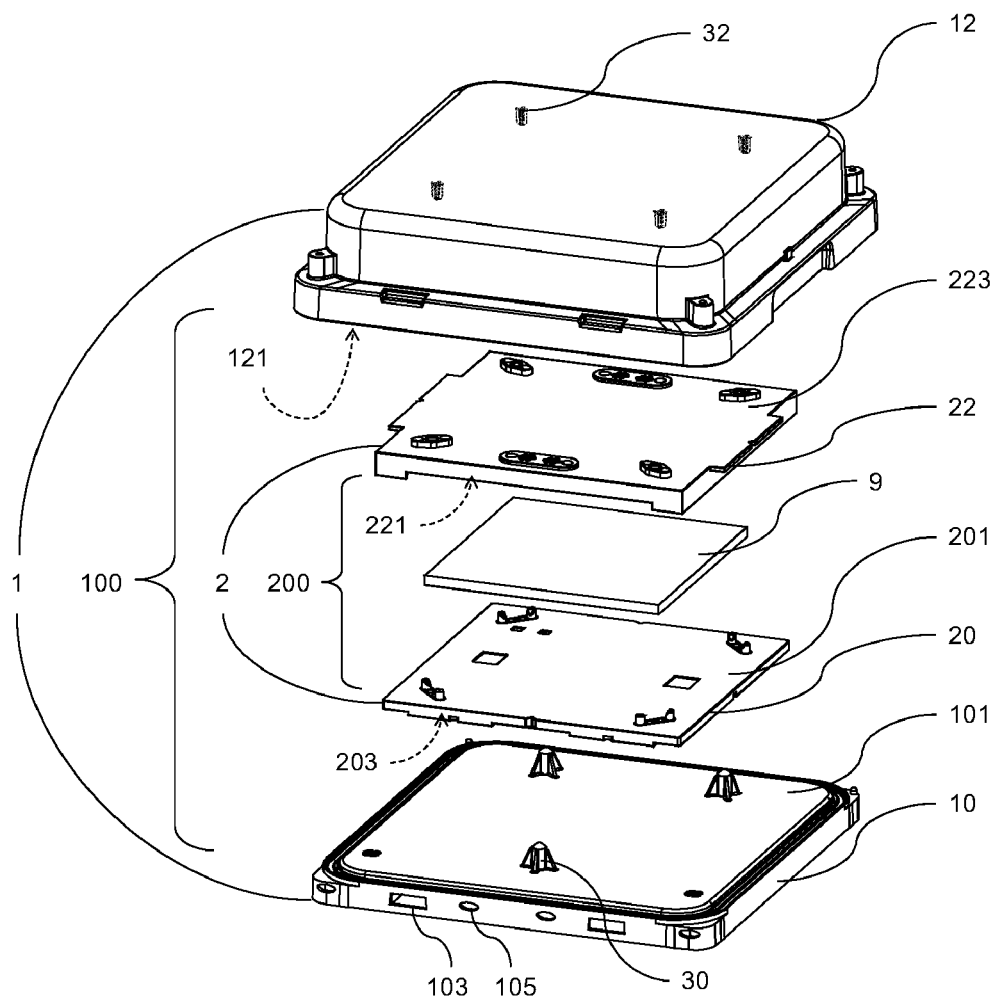
FIG. 1 is an explosive view of the reticle pod of the present invention.

First, referring to FIG. 1, which is an explosive view of the reticle pod of the present invention. As shown in FIG. 1, the reticle pod comprises an outer container 1 and an inner container 2, wherein the outer container 1 comprises a lower cover of outer container 10 having a first inner surface 101 on which a plurality of first supporters 30 are formed, and an upper cover of outer container 12 having a second inner surface 121 on which a plurality of protruding second supporters 32 are formed, a first accommodation space 100 being formed between the first inner surface 101 and the second inner surface 121 for accommodating and fastening the inner container 2 when the lower cover of outer container 10 and the upper cover of outer container 12 are joined together; the inner container 2 comprises a lower cover of inner container 20, which is placed in the first accommodation space 100 and in contact with the plurality of first supporters 30 and has a first inner surface of inner container 201, and an upper cover of inner container 22, which is placed in the first accommodation space 100 and has a second inner surface of inner container 221 and an outer surface of upper cover of inner container 223 which is on the opposite side of the second inner surface of inner container 221, a second accommodation space 200 being formed between the first inner surface of inner container 201 and the second inner surface of inner container 221 for accommodating a reticle 9 when the lower cover of inner container 20 and the upper cover of inner container 22 are joined together.

Furthermore, four sides of the lower cover of outer container 10 are disposed with a plurality of drain holes 105, which are shown as round holes in FIG. 1; and a pair of lock holes 103, which are shown as rectangular holes in FIG. 1, are further disposed on two opposite sides among four sides of the lower cover of outer container 10. Apparently, as the lower cover of outer container 10 is disposed with a latch (not shown in Figure), when the latch is turned to close the outer container, the latch projects into the lock holes 103. An objective of disposing a plurality of drain holes 105 is as thus: after the lower cover of outer container 10 of the reticle pod of the present invention is cleaned with water, water molecules remaining in the lower cover of outer container 10 can be drained out through the plurality of drain holes 105 after heating and baking processes are performed, and the rate of reticle contamination caused by the reticle pod can therefore be decreased.

Figure 2:
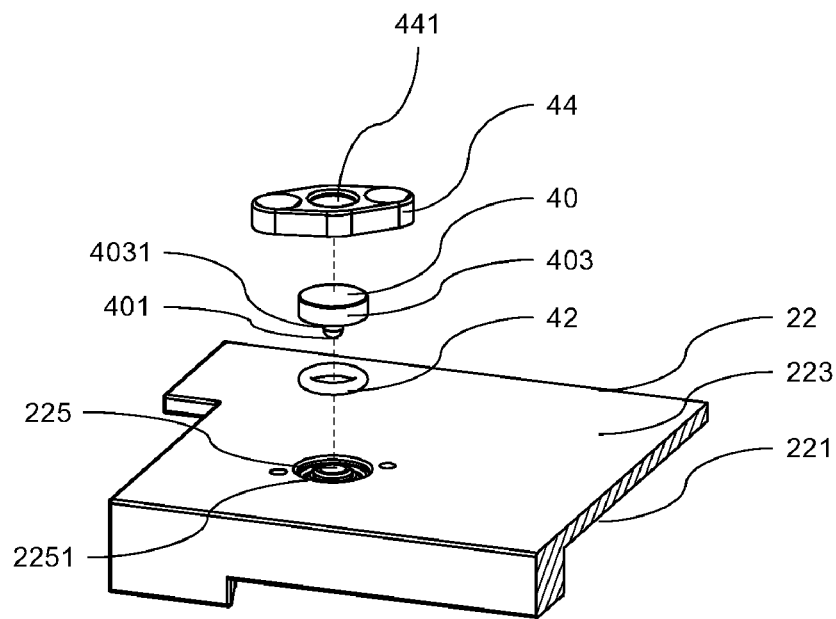
FIG. 2 is a view of the retainer of the upper cover of inner container of the present invention.

Then, referring to FIG. 2, which is a view of the retainer of the upper cover of inner container of the present invention. As shown in FIG. 2, a plurality of through holes 225 are disposed between the second inner surface 221 and the outer surface of upper cover 223 of the upper cover 22 of the inner container of the reticle pod; in addition, an O-shaped recess 2251 is formed as surrounding each of the through holes 225 and is disposed with a spring element 42. Moreover, a retainer 40 is disposed in each of the through holes 225. The retainer 40 is formed by a supporting convex pillar 401 with a size fitting for being inserted into a through hole 225 and an O-shaped protruding portion 403 correspondingly disposed in the O-shaped recess 2251; the supporting convex pillar 401 and the O-shaped protruding portion 403 are an integrated structure; wherein, the supporting convex pillar 401 is inserted into the through hole 225, and the O-shaped protruding portion 403 is in the O-shaped recess 2251 and the protruding portion 4031 of the O-shaped protruding portion 403 is in contact with the spring element 42; apparently, the length of the supporting convex pillar 401 of the retainer 40 is larger than that of the protruding portion 4031 of the O-shaped protruding portion 403. Additionally, the position of each retainer 40 corresponds to each second supporter 32 of the upper cover of outer container 12. Furthermore, on a side of each retainer 40 on the outer surface of upper cover of inner container 223 of the upper cover of inner container 22, a first fastener 44 that fastens the retainer 40 is respectively disposed, the first fastener 44 having a hole 441 with a size smaller than the retainer 40 so that part of the surface of the retainer 40 can be exposed; therefore, with the O-shaped recess 2251 and the first fastener 44 being joined together, the retainer 40 can be fastened and prevented from dropping down. Moreover, the first fastener 44 of the present invention is lock-fastened to the inner container 2 for storing the reticle with a screw and can also be disposed in the inner container 2 for storing the reticle either via being snap-fitted or adhered to the inner container 2, the way of which is not limited in the present invention. And the material of retainer 40 is a wear-resistant polymer material so that friction that may generate particles and dusts which contaminate the reticle 9 in the inner container 2 can be prevented.

Figure 3:
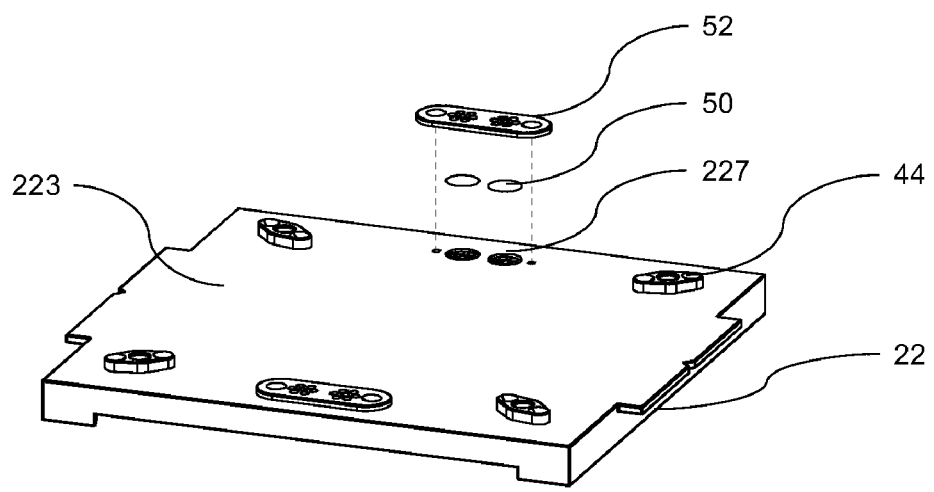
FIG. 3 is a view of the filter device of the upper cover of inner container of the present invention.

Referring then to FIG. 3, which is a view of filter device of the upper cover of inner container of the present invention. As shown in FIG. 3, on the upper cover of inner container 22 of the reticle pod, a plurality of filtration holes 227 penetrating the upper cover of inner container 22 are disposed, and a filter material 50 is disposed on each of the filtration holes 227. The filter material 50 of the present invention can be a porous filter membrane and can be selected from the group consisting of: glass-fiber filter, static electricity filter, electrically conductive filter membrane, PTFE filter, and porous ceramic material, which is not limited in the present invention. Moreover, a second retainer 52 can be further disposed on the filtration hole 227 to reinforce the fastening; the second retainer 52 can be lock-fastened to the inner container 2 via a screw or in other ways, the way of lock-fastening the second retainer 52 is not limited in the present invention. In a preferred embodiment of the present invention, two filtration holes form a set and the upper cover of inner container 22 is disposed with two sets of filtration holes 227, and yet the actual number of filtration holes 227 disposed is not limited in the present invention.

Figure 4:
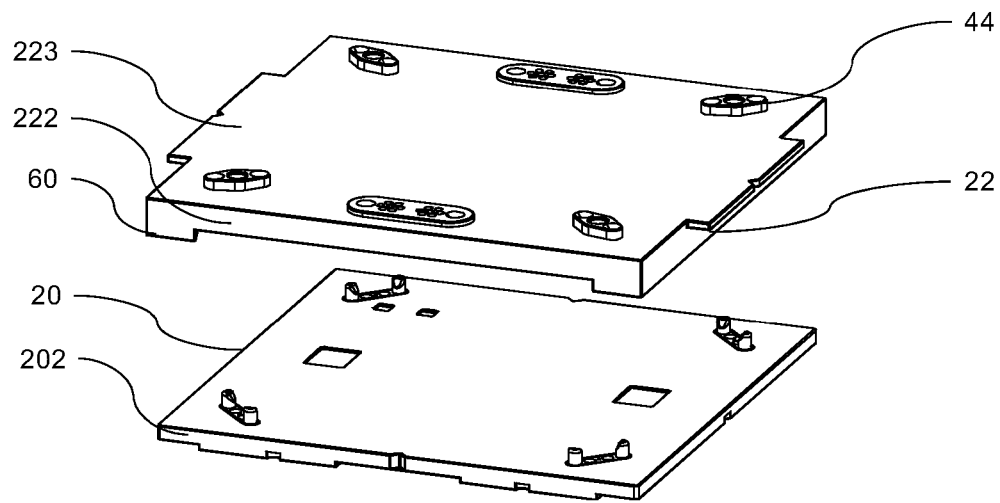
FIG. 4 is a view of the foolproof structure of the upper cover of inner container of the present invention.

And then, referring to FIG. 4, which is a view of foolproof structure of the upper cover of inner container of the present invention. As shown in FIG. 4, an integrated foolproof structure 60 is respectively formed on four corners formed on the periphery 222 of the upper cover of inner container 22. The characteristic is in that a portion of the foolproof structure 60 of the present invention will protrude from the periphery 222 of the upper cover of inner container 22, and thus, when the upper cover of inner container 22 and the lower cover of inner container 20 are joined together, the protruding portion of the foolproof structure 60 will be snap-fitted on the periphery 22 of the lower cover of inner container 20; since the foolproof structure 60 is respectively formed on the four corners, when the inner container 2 is closed, the upper cover 22 and the lower cover 20 are successfully joined only when all the foolproof structures 60 on four corners are snap-fitted, the foolproof effect being thus achieved. Moreover, as the length and the width of the inner container 2 are not the same, the length-to-width ratio can also be taken into consideration when the inner container 2 is closed for determining whether the closing of inner container 2 is correctly performed.

Figure 5:
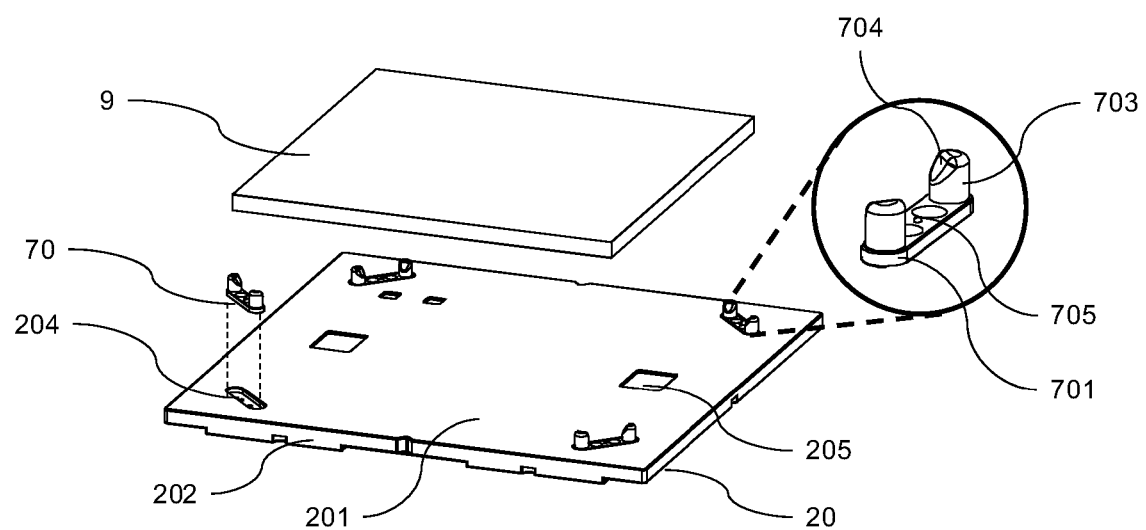
FIG. 5 is a view of the limiter of the lower cover of inner container of the present invention.

Referring then to FIG. 5, which is a view of the limiter of lower cover of inner container of the present invention. As shown in FIG. 5, each of the four corners of the first inner surface of inner container 201 of the lower cover of inner container 20 has a recess 204, in which a limiter 70 is respectively disposed; the limiter 70 is a horizontal bar-shaped substrate 701 with two convex columns 703 disposed on two sides, and a bevel 704 is respectively formed at the open end of each of the convex columns 703; a supporting protruding point 705 is further disposed between the two convex columns 703 of the horizontal bar-shaped substrate 701, and the supporting protruding point 705 and the two convex columns 703 are disposed on a straight line. When the limiter 70 is disposed in the recess 204 of the first inner surface of inner container 201, the top surface of the horizontal bar-shaped substrate 701 of the limiter 70 and the first inner surface of inner container 201 will be on the same horizontal level. When the reticle 9 is to be placed onto the first inner surface of inner container 201, if the reticle 9 shifts its position, the reticle 9 can be guided to the correct position by the bevels 704 of the convex columns 703 and each of the four corners of the reticle 9 is in contact with the supporting protruding point 705 on the horizontal bar-shaped substrate 701; the reticle 9 is thus placed onto the first inner surface of inner container 201.

Moreover, the pair of convex columns 703 on each limiter 70 can serve as identification devices on the robot to identify reference point for reticle alignment so that the robot can accurately grip the reticle. Furthermore, in addition to being disposed at four corners of the first inner surface 201 of the inner container 20, each limiter 70 of the present invention can be alternatively disposed on the point of intersection at 146 mm on each side of the first inner surface 201 of the inner container 20; therefore, the position of each limiter 70 on the first inner surface 201 is not limited in the present invention as long as the position of each limiter 70 is on or beyond the point of intersection at 146 mm on each side of the first inner surface 201, such design ensuring that the supporting protruding point 705 of each limiter 70 is only in contact with the edge of the reticle and does not cause wear of or damage to pattern on the reticle.

Figure 6:
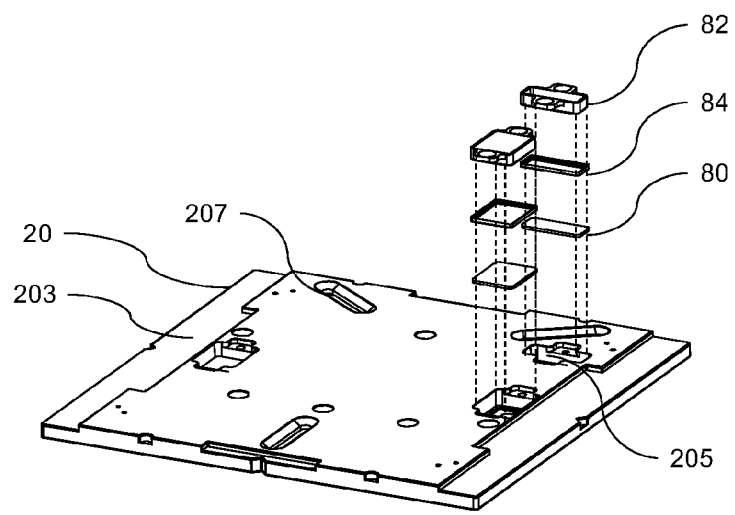
FIG. 6 is a view of the window of the lower cover of inner container of the present invention.

Then, referring to FIG. 6, which is a view of the window of the lower cover of inner container of the present invention. As shown in FIG. 6, a plurality of windows 205 are disposed on the outer surface of lower cover of inner container 203 which is on the opposite side of the first inner surface of inner container 201 of the lower cover of inner container 20, and a transparent substrate 80 made of transparent glass, transparent plastic material, or other materials is respectively disposed in each of the windows 205; on the transparent substrate 80, a third fastener 82 is further disposed for snap-fitting the transparent substrate 80 to the window 205 and prevent the transparent substrate 80 from dropping down. The third fastener 82 is a frame-shaped member with a size fitting to the window, and thus the reticle inside can be monitored from outside the lower cover of inner container 20 via the window 205. Therefore, during the process, there will be signals from platforms to inspect the process and function of a reticle via the window 205. Moreover, a ring-shaped pad 84 is disposed between the transparent substrate 80 and the third fastener 82 and is made of polymer material such as PTFE; the primary objective of disposing the ring-shaped pad 84 is to isolate and thus prevent the transparent substrate 80 from contacting the third fastener 82 so that proper flexibility is allowed to protect the transparent substrate 80 from being damaged. Furthermore, after the third fastener 82 is disposed on the lower cover of inner container 20, the third fastener 82 and the outer surface of lower cover of inner container 203 are at the same horizontal level, and thus the placement of the inner container 2 in the outer container 2 will not be hindered. The third fastener 82 of the present invention is lock-fastened onto the outer surface of lower cover of inner container 203 of lower cover of inner container 20 via a screw, and the way of lock-fastening is not limited in the present invention.

Figure 7:
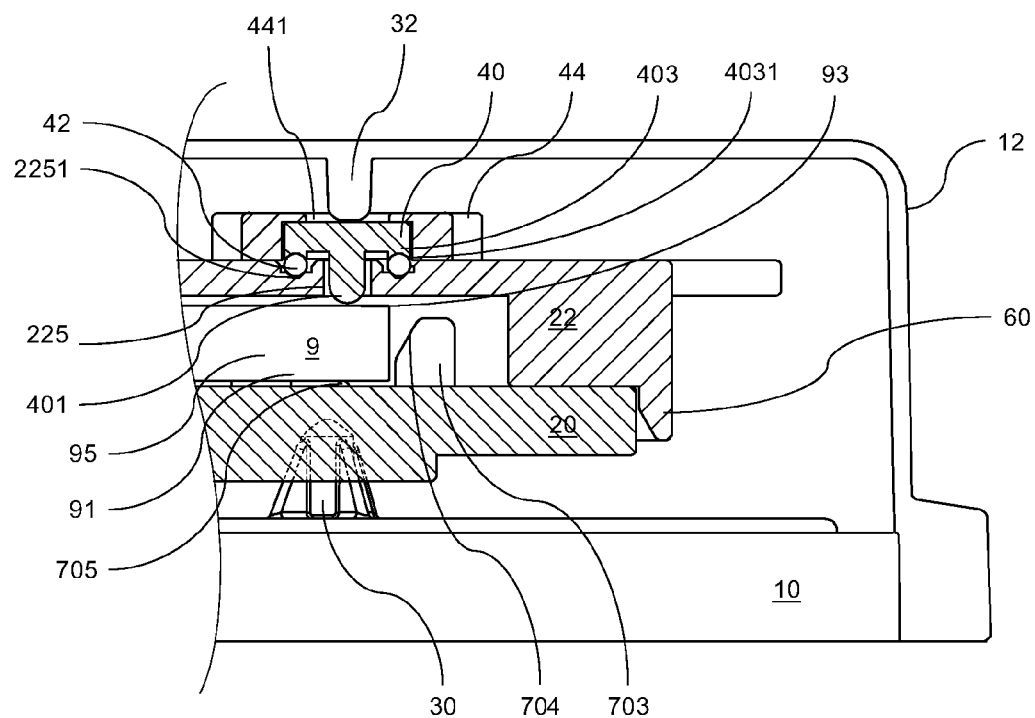
FIG. 7 is a sectional view of the reticle pod of the present invention.
Figure 8:
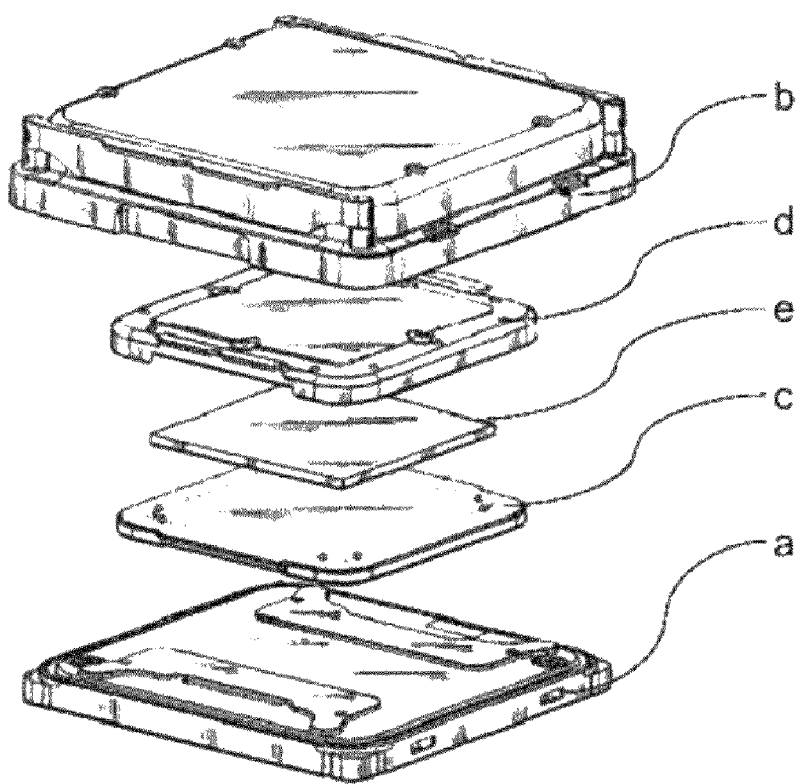
FIG. 8 is a view of the reticle pod of the prior art.

Referring to FIG. 7, which is a sectional view of the reticle pod of the present invention. As shown in FIG. 7, the reticle 9 is first placed on the lower cover of inner container 20 of the inner container 2, and, as described above, the four corners of the lower surface 91 of the reticle 9 will be first placed on the supporting protruding points 705 of the limiters 70 disposed on the four corners of the first inner surface of inner container 201. The two columns 703 on two sides of each supporting protruding point 705 will be located right on the periphery 95 of the reticle 9 (namely, two sides of the right-angle corner). Thus, the two sides of each of the four right-angle corners of the reticle 9 will be respectively clamped by each convex column 703 and the reticle 9 can be prevented from shifting. In the following, facilitated by the guidance of the foolproof structure 60 of the upper cover of inner container 22, the upper cover of inner container 22 is joined with the lower cover of inner container 20 in the designated direction and an inner container 2 for protecting the reticle 9 is thus formed.

Then, the inner container 2 is placed onto the plurality of first supporters 30 of the lower cover of outer container 10 of the outer container 1; wherein, the first supporters 30 correspond to the positioning groove 207 of the outer surface of lower cover of inner container 203 of the lower cover of inner container 20 (referring to FIG. 6), and therefore, the inner container 2 is guided by the positioning groove 207 to the correct position when being placed. The upper cover of outer container 12 is then closed; wherein, when the upper cover of outer container 12 is to be closed, each of the second supporters 32 on the upper cover of outer container 12 aligns with the retainer 40 in each of the through holes 225 of the upper cover of inner container 22. When the upper cover of outer container 12 is closed, each second supporter 32 is driven by the closing action to exert a downward force and impose pressure on the exposed portion of the retainer 40 in the through hole 225; when the retainer 40 is pressed, the O-shaped protruding portion 403 will then impose pressure on the O-shaped spring element 42 in the O-shaped recess 2251, and the retainer 40 will then press further down and inward (i.e. when the O-shaped spring element 42 is pressed, there is flexible space for the retainer 40 to press inward, and contrariwise, when the O-shaped spring element 42 is not pressed, its flexibility facilitates the retainer 40 to resume the original position); the supporting convex pillars 401 integrated with the O-shaped protruding portions 403 will also be pressed down and inward and will then be in contact with four corners of the upper surface 93 of the reticle 9, in other words, when the upper cover of outer container 12 is closed, the supporting convex pillars 401 of the retainers 40 at four corners of the reticle 9 will press the four corners of the upper surface 93 of the reticle 9, and therefore the reticle 9 can be stably fastened in the inner container 2 with the existent support from the supporting protruding points 705 of the four corners of the lower surface 91 of the reticle 9; the inner container 2 can also be stabilized with the second supporters 32 of the upper cover of outer container 12 pressing inward, and the security of the reticle 9 in the storing and transporting process is further ensured.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reticle pod, in which a reticle is fastened in an inner container and said inner container is placed in an outer container, said outer container comprising:
   a lower cover of said outer container, having a first inner surface, a plurality of first supporters being formed on said first inner surface;
   an upper cover of said outer container, having a second inner surface, a plurality of second supporters being formed on said second inner surface, said first inner surface and said second inner surface forming a first accommodation space for accommodating said inner container when said lower cover of outer container and said upper cover of outer container are joined together; and
   said inner container comprising:
   a lower cover of said inner container, being disposed in said first accommodation space and being in contact with said plurality of first supporters, said lower cover of inner container having a first inner space of said inner container; and
   an upper cover of said inner container, being in said first accommodation space and having a second inner surface of said inner container and an outer surface of said upper cover of inner container which is on opposite side of said second inner surface, said first inner surface of inner container and said second inner surface of inner container forming a second accommodation space for accommodating said reticle when said lower cover of inner container and said upper cover of inner container are joined together, wherein, the characteristic of said upper cover of inner container is in that:
   a plurality of through holes are formed between said second inner surface and said outer surface of said upper cover of inner container, an O-shaped recess being formed around each of said plurality of through holes to surround said through hole, and a spring element being disposed in said O-shaped recess; and
   a plurality of retainers are disposed in said plurality of through holes, the position of each of said plurality of retainers corresponding to each of said second supporters of said upper cover of outer container, each of said retainers being formed by a supporting convex pillar and an O-shaped protruding portion correspondingly disposed in said O-shaped recess, length of said supporting convex pillar being larger than length of said O-shaped protruding portion and said supporting convex pillar and said O-shaped protruding portion being an integrated structure, wherein, said O-shaped protruding portion is in said O-shaped recess and said O-shaped protruding portion is in contact with said spring element.

2. The reticle pod according to claim 1, wherein on a side of one of said plurality of retainers on said outer surface of said upper cover of inner container, a first fastener is respectively disposed for fastening one of said plurality of retainers.

3. The reticle pod according to claim 1, wherein a material of said plurality of retainers is a wear-resistant polymer material.

4. The reticle pod according to claim 2, wherein a plurality of filter devices are further disposed on top of said upper cover of inner container, each of said filter devices comprising:
    a plurality of filtration holes formed on said upper cover of inner container;
    a filter material, mounted on said plurality of filtration holes; and
    a second fastener, disposed on said plurality of filtration holes and said filter material for fastening said filter device.

5. The reticle pod according to claim 4, wherein said filter material is a porous filter membrane.

6. The reticle pod according to claim 1, wherein an integrated foolproof structure is further respectively formed on four corners on periphery of said upper cover of inner container, the characteristic is in that:
    a portion of said foolproof structure protrudes from said periphery of said upper cover of inner container, and when said upper cover of inner container and said lower cover of inner container are joined together, said portion of said foolproof structure that protrudes is snap-fitted on said periphery of said lower cover of inner container.

7. The reticle pod according to claim 4, wherein said lower cover of inner container is further disposed with a plurality of windows, each of said plurality of windows comprising:
    a transparent substrate, mounted on said window from an outer surface of lower cover of inner container on opposite side of said first inner surface of inner container;
    a third fastener, disposed on said window and said transparent substrate from said outer surface of lower cover of inner container for fastening said transparent substrate; and
    a ring-shaped pad, disposed between said transparent substrate and said third fastener.

8. The reticle pod according to claim 7, wherein said first fastener, said second fastener, and said third fastener are lock-fastened onto said reticle pod via screws.

9. A reticle pod, in which a reticle is fastened in an inner container and said inner container is placed in an outer container, said outer container comprising:
    a lower cover of said outer container, having a first inner surface, a plurality of first supporters being formed on said first inner surface;
    an upper cover of said outer container, having a second inner surface, a plurality of second supporters being formed on said second inner surface, said first inner surface and said second inner surface forming a first accommodation space for accommodating said inner container when said lower cover of outer container and said upper cover of outer container are joined together; and
said inner container comprising:
    an upper cover of said inner container, being in said first accommodation space and having a second inner surface of said inner container and an outer surface of said upper cover of inner container which is on opposite side of said second inner surface, said first inner surface of inner container and said second inner surface of inner container forming a second accommodation space for accommodating said reticle when said lower cover of inner container and said upper cover of inner container are joined together; and
    a plurality of limits, disposed on four corners of said first inner surface of said lower cover of inner container, wherein, the characteristic of said upper cover of inner container is in that:
    a plurality of through holes are formed between said second inner surface and said outer surface of said upper cover of inner container, an O-shaped recess being formed around each of said plurality of through holes to surround said through hole, and spring element being disposed in said O-shaped recess; and
    a plurality of retainers are disposed in said plurality of through holes, the position of each of said plurality of retainers corresponding to each of said second supporters of said upper cover of outer container, each of said retainers being formed by a supporting convex pillar and an O-shaped protruding portion correspondingly disposed in said O-shaped recess, length of said supporting convex pillar being larger than length of said O-shaped protruding portion and said supporting convex pillar and said O-shaped protruding portion being an integrated structure, wherein, said O-shaped protruding portion is in said O-shaped recess and said O-shaped protruding portion in contact with said spring element.

10. The reticle pod according to claim 9, wherein each of said limits comprises:
    a horizontal bar-shaped substrate;
    two convex columns, disposed on two sides of said horizontal bar-shaped substrate; and
    a supporting protruding point, disposed between said two columns of said horizontal bar-shaped substrate.

11. The reticle pod according to claim 9, wherein material of said limiters is a wear-resistant polymer material.

12. The reticle pod according to claim 9, wherein a bevel is formed at open end of each of said convex columns of said limiters.

13. A reticle pod, in which a reticle is fastened in an inner container and said inner container is placed in an outer container, said outer container comprising:
    a lower cover of said outer container, having a first inner surface, a plurality of first supporters being formed on said first inner surface;
    an upper cover of said outer container, having a second inner surface, a plurality of second supporters being formed on said second inner surface, said first inner surface and said second inner surface forming a first accommodation space for accommodating said inner container when said lower cover of outer container and said upper cover of outer container are joined together; and
    a lower cover of said inner container, being disposed in said first accommodation space and being in contact with said plurality of first supporters, said lower cover of inner container having a first inner surface of inner container; and
    an upper cover of said inner container, being in said first accommodation space and having a second inner surface of said inner container and an outer surface of said upper cover of inner container which is on opposite side of said second inner surface, said first inner surface of inner container and said second inner surface of inner container forming a second accommodation space for accommodating said reticle when said lower cover of inner container and said upper cover of inner container are joined together, wherein, the characteristic of said upper cover of inner container is in that:

a plurality of through holes are formed between said second inner surface and said outer surface of said upper cover of inner container, an O-shaped recess being formed around each of said plurality of through holes to surround said through hole, and a spring element being disposed in said O-shaped recess; and a plurality of retainers are disposed in said plurality of through holes, the position of each of said plurality of retainers corresponding to each of said second supporters of said upper cover of outer container, each of said retainers being formed by a supporting convex pillar and an O-shaped protruding portion correspondingly disposed in said O-shaped recess, wherein, said O-shaped protruding portion is in said O-shaped recess and said O-shaped protruding portion is in contact with said spring element.

14. The reticle pod according to claim 13, wherein on a side of one of said plurality of retainers on said outer surface of upper cover of inner container of said upper cover of inner container, a first fastener is respectively disposed for fastening one of said plurality of retainers.

15. The reticle pod according to claim 13, wherein a material of said plurality of retainers is a wear-resistance polymer material.

16. The reticle pod according to claim 14, wherein a plurality of filter devices are further disposed on top of said upper cover of inner container, each of said filter devices comprising:

a plurality of filtration holes, formed on said upper cover of inner container;

a filter material, mounted on said plurality of filtration holes; and a second fastener, disposed on said plurality of filtration holes and said filter material for fastening said filter device.

17. The reticle pod according to claim 13, wherein an integrated foolproof structure is further respectively formed on four corners on periphery of said upper cover of inner container, the characteristic is in that:

a portion of said foolproof structure protrudes from said periphery of said upper cover of inner container, and when said upper cover of inner container and said lower cover of inner container are joined together, said portion of said foolproof structure that protrudes is snap-fitted on said periphery of said lower cover of inner container.

18. The reticle pod according to claim 16, wherein said lower cover of inner container is further disposed with a plurality of windows, each of said plurality of windows comprising:

a transparent substrate, mounted on said window from an outer surface of lower cover of inner container on opposite side of said first inner surface of inner container;

a third fastener, disposed on said window and said transparent substrate from said outer surface of lower cover of inner container for fastening said transparent substrate; and a ring-shaped pad, disposed between said transparent substrate and said third fastener.

* * * * *